(12) United States Patent
Anc et al.

(10) Patent No.: US 10,475,967 B2
(45) Date of Patent: Nov. 12, 2019

(54) WAVELENGTH CONVERTERS WITH IMPROVED THERMAL CONDUCTIVITY AND LIGHTING DEVICES INCLUDING THE SAME

(71) Applicant: OSRAM Opto Semiconductors GmbH, Regensburg (DE)

(72) Inventors: Maria Anc, Groveland, MA (US); Mark Hannah, Sterling, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 221 days.

(21) Appl. No.: 15/499,598

(22) Filed: Apr. 27, 2017

(65) Prior Publication Data

US 2018/0313501 A1    Nov. 1, 2018

(51) Int. Cl.
*H01L 33/50* (2010.01)
*H01L 33/64* (2010.01)
*C09K 11/70* (2006.01)

(52) U.S. Cl.
CPC .......... *H01L 33/502* (2013.01); *C09K 11/703* (2013.01); *H01L 33/501* (2013.01); *H01L 33/644* (2013.01); *H01L 33/507* (2013.01); *H01L 33/641* (2013.01)

(58) Field of Classification Search
CPC ..... H01L 33/02; H01L 33/501; H01L 33/644; H01L 33/502; H01L 33/641; H01L 33/507; C09K 11/703
USPC ........................................................ 362/293
See application file for complete search history.

(56) References Cited

U.S. PATENT DOCUMENTS

| | | | |
|---|---|---|---|
| 2006/0153257 A1* | 7/2006 | Franjic | H01S 3/042 372/34 |
| 2007/0295968 A1 | 12/2007 | Tan et al. | |
| 2011/0121331 A1 | 5/2011 | Simonian et al. | |
| 2013/0189803 A1 | 7/2013 | Nasaani et al. | |
| 2014/0021503 A1* | 1/2014 | Yoshida | H01L 33/507 257/98 |

(Continued)

FOREIGN PATENT DOCUMENTS

CN          104031388 A       9/2014

OTHER PUBLICATIONS

Anc et al., Progress in Non-Cd Quantum Dot Development for Lighting Applications, ECS Journal of Solid State Science and Technology, 2013, vol. 2, Issue 2, pp. R3071-R3082.

(Continued)

*Primary Examiner* — Anh T Mai
*Assistant Examiner* — Hana S Featherly
(74) *Attorney, Agent, or Firm* — Slater Matsil, LLP

(57) ABSTRACT

Wavelength converters (103) with improved thermal conductivity are described. In some embodiments the wavelength converters include a thermally conductive component (204, 206) and a wavelength conversion material (205) mixed with or dispersed in the thermally conductive component. The wavelength conversion material (205) includes non-agglomerated quantum dots. The presence of the thermally conductive component may facilitate removal of heat from the wavelength converter, potentially reducing the impact of elevated temperature on the performance of the wavelength conversion material therein. Methods of making such wavelength converters and lighting devices including such wavelength converters are also described.

13 Claims, 10 Drawing Sheets

(56) References Cited

U.S. PATENT DOCUMENTS

| | | | |
|---|---|---|---|
| 2014/0077132 A1* | 3/2014 | Ijiro | B22F 1/0051 |
| | | | 252/301.36 |
| 2015/0028365 A1 | 1/2015 | Kurtin et al. | |
| 2015/0291876 A1 | 10/2015 | Koole et al. | |
| 2016/0369954 A1 | 12/2016 | Anc et al. | |
| 2017/0040496 A1 | 2/2017 | Martin | |

OTHER PUBLICATIONS

Assignee's pending Internat'l PCT Appl. No. PCT/US2017/32676 filed May 15, 2017 for "Wavelength Converters Including a Porous Matrix, Lighting Devices Including the Same, and Methods of Forming the Same" (Inventor Maria Anc), labeled OSI.

* cited by examiner

WAVELENGTH CONVERTERS WITH IMPROVED THERMAL CONDUCTIVITY AND LIGHTING DEVICES INCLUDING THE SAME

FIELD

The present disclosure generally relates to wavelength converters and lighting devices including the same. More particularly, the present disclosure generally relates to wavelength converters with improved thermal conductivity, and lighting devices including such wavelength converters.

BACKGROUND

Light sources such as light emitting diodes (LEDs) can generate visible or non-visible light (hereinafter, "primary light") in a specific region of the electromagnetic spectrum, such as in the visible (e.g., blue, red, green, etc.), ultra-violet (UV), near-UV, and/or infrared regions, combinations thereof, and/or light in some other region of the electromagnetic spectrum. The wavelength or wavelength range of the emitted primary light may depend on various parameters, such as but not limited to the material composition of an LED. In any case, the primary light may be light of a first wavelength or wavelength range.

Wavelength converters may be used to construct a lighting device that produces light (hereinafter, "secondary light") that is of a second wavelength or wavelength range that is different from the first wavelength or wavelength range of primary light incident thereon. Such wavelength converters generally include one or more wavelength conversion materials that function to convert all or a portion of primary light incident thereon to secondary light, e.g., via photoluminescence. The second wavelength/wavelength range may depend on various parameters, such as but not limited to the type and composition of wavelength conversion material in the wavelength converter. Secondary light of a desired wavelength/wavelength range may therefore be attained by proper selection of wavelength conversion material. An LED light source that is combined with a wavelength converter may be understood to be a "wavelength converted LED."

Quantum dots (QDs) (also referred to as semiconductor nanocrystals) are relatively new materials that have potential use in the lighting industry. Like conventional phosphor particles, some quantum dots have the ability to absorb incident primary light and to emit secondary light in another portion of the electromagnetic spectrum. Many QDs exhibit properties that can be leveraged to create wavelength converters with precisely designed output spectra. Such properties include, for example, a broad absorption spectrum (freedom of the choice of the pump (primary light) wavelength) and emission of secondary light within a narrow-band (25-50 nm) with the peak emission wavelength determined by the material and size of the QDs. The peak emission wavelength of the QDs may therefore be finely tuned, e.g., within few nanometers, by controlling their size and/or composition. QDs can thus enable lighting designers to create wavelength converters that produce secondary light that includes a finely tuned spectrum of emission colors. Quantum dots have therefore been investigated for potential use in the formation of novel wavelength converters for semiconductor devices such as LEDs.

A significant amount of heat may be generated by the conversion of primary light to secondary light by wavelength conversion materials in a wavelength converter, as well as operation of a light source generating the primary light. Inadequate dissipation of heat can cause the temperature of a wavelength converter to increase substantially during the operation of a lighting device, potentially degrading performance of the wavelength conversion material and the lighting device as a whole Accordingly, there is an interest in the development of new approaches to managing the heat in lighting devices such as wavelength converted LEDs.

BRIEF DESCRIPTION OF THE DRAWINGS

Reference is now made to the following detailed description which should be read in conjunction with the following figures, wherein like numerals represent like parts.

DETAILED DESCRIPTION

Figure 1:
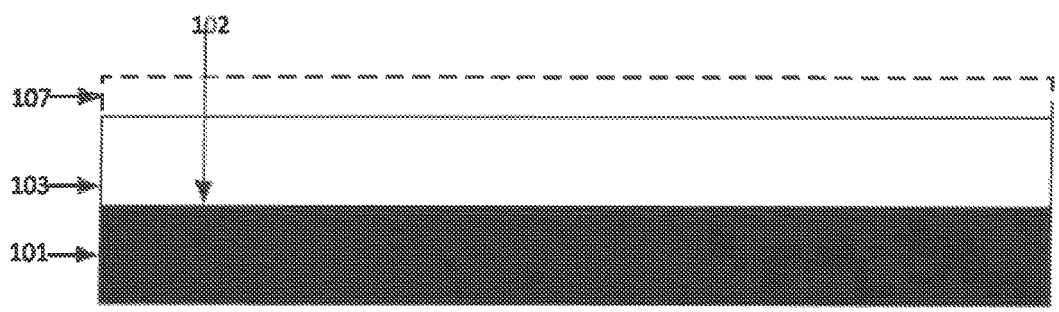
FIG. 1 illustrates one example of a lighting device including a wavelength converter consistent with the present disclosure.

The present disclosure will now proceed with reference to the accompanying drawings, in which example embodiments consistent with the present disclosure are shown. It should be understood that the examples in the figures are for the sake of illustration and ease of understanding only and that the methods, wavelength converters, and devices described herein may be embodied in many forms and are not limited to the illustrated embodiments in the FIGS. or specific embodiments described herein.

One or more elements of the present disclosure may be numerically designated, e.g., as a first, second, third, etc. element. In this context it should be understood that the numerical designation is for the sake of clarity only (e.g., to distinguish one element from another), and that elements so designated are not limited by their specific numerical designation.

As used herein singular expressions such as "a," "an," and "the" are not limited to their singular form, and are intended to cover the plural forms as well unless the context clearly indicates otherwise. Specific terms/phrases excepted from this understanding include "single layer," and "single layer wavelength converter," which are used herein to designate a single (i.e., one) layer and a wavelength converter that is made up of a single (i.e. one) layer.

As used herein, the terms "substantially" and "about" when used in connection with an amount or range mean plus or minus 5% of the stated amount or the endpoints of the stated range.

As used herein, the term "optically transparent" when used in connection with a material (e.g., a host material, thermally conductive particles, or another material) means that the referenced material transmits greater than or equal to about 80% of incident light, such as greater than or equal to about 90%, greater than or equal to about 95%, greater than or equal to about 99%, or even about 100% of incident light. The incident light may be primary and/or secondary light of a specified wavelength or wavelength range (e.g., ultraviolet, visible, infrared, etc.), and/or may span multiple wavelength ranges. Without limitation, optically transparent materials described herein preferably transmit greater than or equal to about 95% (e.g., greater than or equal to about 99% or even about 100%) of primary and/or secondary light in at least one of the ultraviolet, visible, and infrared regions of the electromagnetic spectrum.

The terms, "light emitting diode," "LED," and "LED light source" are used interchangeably herein, and refer to any light emitting diode or other type of carrier injection/junction-based system that is capable of generating radiation in response to an electrical signal. Thus, the term LED includes but is not limited to various semiconductor-based structures that emit light in response to current, light emitting polymers, light emitting strips, electro-luminescent strips, combination thereof and the like. In particular, the term LED refers to light emitting diodes of all types (including semiconductor and organic light emitting diodes) that may be configured to generate light in all or various portions of one or more of the visible, ultraviolet, and infrared spectrum. Non-limiting examples of suitable LEDs that may be used include various types of infrared LEDs, ultraviolet LEDs, red LEDs, green LEDs, blue LEDs, yellow LEDs, amber LEDs, orange LEDs, and white LEDs. Such LEDs may be configured to emit light over a broad spectrum (e.g., the entire visible light spectrum) or a narrow spectrum.

As used herein, the term "on" is used to describe the relative position of one component (e.g., a first layer) relative to another component (e.g., a second layer). In such instances the term "on" should be understood to indicate that a first component is present above a second component, but is not necessarily in contact with one or more surfaces of the second component. That is, when a first component is "on" a second component, one or more intervening components may be present between the first and second components. In contrast, the term "directly on" should be interpreted to mean that a first component is in contact with a surface (e.g., an upper surface) or a second component. Therefore when a first component is "directly on" a second component, it should be understood that the first component is in contact with the second component, and that no intervening components are present between the first and second components.

Ranges are used herein to describe various features of elements of the present disclosure. It should be understood that the ranges enumerated herein are for the sake of example only, unless expressly indicated otherwise. The ranges herein should also be understood to include all of the individual values of falling within the indicated range as though such values were expressly recited, and to encompass sub ranges within the indicated range as though such sub ranges were expressly recited. By way of example, a range of 1 to 10 should be understood to include the individual values of 2, 3, 4 . . . etc., as well as the sub ranges of 2 to 10, 3 to 10, 2 to 8, etc., as though such values and sub ranges were expressly recited.

The term "thermally conductive component" refers to one or more materials that have a thermal conductivity that greater than the thermal conductivity of optical silicone, i.e., a thermal conductivity greater than 0.2 Watts per meter-Kelvin ($Wm^{-1}K^{-1}$). In embodiments, the thermally conductive component is or includes a "thermally conductive polymer," i.e., a polymer having a thermal conductivity greater than 0.2 $Wm^{-1}K^{-1}$. Alternatively or additionally, in some embodiments the thermally conductive component is of includes "thermally conductive particles," i.e., particles having a thermal conductivity greater than 0.2 $Wm^{-1}K^{-1}$, such as greater than or equal to about 1 $Wm^{-1}K^{-1}$, greater than or equal to about 3 $Wm^{-1}K^{-1}$, or even greater than or equal to about 4 $Wm^{-1}K^{-1}$.

As briefly described in the background, quantum dots are relatively new materials that have been investigated for use in lighting applications. Although research has shown that quantum dots have some promise for use as wavelength conversion materials in lighting devices, research has also shown that their performance in such applications can be affected by temperature. Indeed the inventors have observed that when quantum dots are used as a wavelength conversion material to convert primary light emitted by an LED to secondary light, the efficiency with which such quantum dots converts the primary light to secondary light decreases with increasing temperature, e.g. due to thermal quenching.

One method of assessing the impact of temperature on the performance of quantum dots as a wavelength conversion material is to compare their integrated emission of secondary light at an elevated temperature, such as 100 degrees Celsius to their integrated emission of secondary light at room temperature. A decrease in the integrated emission of secondary light at elevated temperature (relative to room temperature) may be understood to correlate to a reduction in efficiency with which such materials emit secondary light. With that in mind, the inventors observed that wavelength converters formed by dispersing quantum dot particles (as a wavelength conversion material) in a (non-thermally conductive) host material such as a silicone or an acrylate may exhibit an integrated emission of secondary light at 100 degrees Celsius that is over 40% less than the integrated emission of secondary light by the wavelength converter at room temperature (e.g., 25 degrees Celsius). That reduction highlights one challenge associated with the use of quantum dots in wavelength converters, particularly in wavelength converted LED and/or laser assisted remote phosphor applications—where significant amounts of heat may be produced by the conversion of primary to secondary light as well as operation of the light source.

The reduction in integrated emission of secondary light by quantum dots and other wavelength conversion materials at elevated temperature may be compounded by the fact that many materials that are used as a host material of a wavelength converter have a relatively low thermal conductivity. Such host materials are relatively poor thermal conductors, and therefore may be unable to conduct or transfer heat at a rate that is sufficient to prevent temperatures from rising to a point where performance of a wavelength converter is negatively affected.

With the foregoing in mind, one aspect of the present disclosure relates to wavelength converters that exhibit improved thermal conductivity. Generally, the wavelength converters described herein include a thermally conductive component and at least one wavelength conversion material dispersed in or mixed with the thermally conductive component.

In various embodiments the at least one wavelength conversion material is or includes a first wavelength conversion material, wherein the first wavelength conversion material is or includes quantum dots (e.g., non-agglomerated quantum dots, also referred to as non-agglomerated semiconductor nanocrystals) that are configured to convert primary light incident thereon to secondary light. In embodiments, the first wavelength conversion material comprises, consists of, or consists essentially of non-agglomerated quantum dots. Alternatively or additionally, the at least one wavelength conversion material may be or include a second wavelength conversion material, wherein the second wavelength conversion material is a wavelength conversion material other than quantum dots, e.g., particles of one or more inorganic phosphors.

In any case, the thermally conductive component is at least one thermally conductive polymer, thermally conductive particles, or a combination thereof. When the thermally conductive particles are used, in some embodiments such particles are or include particles of at least one material that has a high thermal conductivity, i.e., particles of at least one material having a thermal conductivity that is greater than or equal to about 4 $Wm^{-1}K^{-1}$, such as greater than or equal to about 10 $Wm^{-1}K^{-1}$, or even greater than or equal to about 30 $Wm^{-1}K^{-1}$. Alternatively, in some embodiments the thermally conductive component is a thermally conductive polymer, such as but not limited to a hybrid inorganic-organic polymer having a thermal conductivity greater than 0.2 $Wm^{-1}K^{-1}$.

For convenience and ease of understanding the present disclosure focuses on embodiments in which the wavelength converter is in the form of a substantially flat layer that includes a thermally conductive component and at least one wavelength conversion material mixed with or dispersed in the thermally conductive component. It should be understood that such description is for the sake of example only, and that the wavelength converters described herein need not be in the form of a substantially flat layer. Indeed the present disclosure envisions the use of wavelength converters that have a wide variety of different shapes. Indeed in embodiments the wavelength converters described herein may have a curved or lenticular cross section, an irregular cross section, or the like.

In instances where the thermally conductive component is or includes thermally conductive particles, the wavelength converter may be in the form of a layer of a mixture of those thermally conductive particles and at least one wavelength conversion material, and optionally a host matrix material (having relatively low thermal conductivity). Alternatively where the thermally conductive component is a thermally conductive polymer, the thermally wavelength converter may be in the form of a layer of the thermally conductive polymer, wherein at least one wavelength conversion material is dispersed within the thermally conductive polymer.

The wavelength converters described herein may exhibit improved thermal conductivity relative to otherwise similar wavelength converters that do not include a thermally conductive component such as thermally conductive particles or a thermally conductive polymer. The wavelength converters consistent with the present disclosure may therefore exhibit improved performance at elevated temperatures, relative to wavelength converters that do not include a thermally conductive component. More particularly, the wavelength converters described herein may exhibit a first integrated emission (of secondary light) at room temperature and a second integrated emission (again, of secondary light) at 100 degrees Celsius, wherein the second integrated emission is greater than 60% of the first integrated emission, such as greater than or equal to about 70% of the first integrated emission, greater than or equal to about 80% of the first integrated emission, greater than or equal to about 90% of the first integrated emission, greater than or equal to about 95% of the first integrated emission, or even greater than or equal to about 99% of the first integrated emission. Without wishing to be bound by theory, it is believed that integrating and/or co-mingling thermally conductive component with a wavelength conversion material enables more rapid transfer of heat away from the wavelength converter. Thermal quenching of the wavelength conversion material(s) therein is thereby limited, resulting in a corresponding improvement in performance of the wavelength conversion material at the operating conditions of a wavelength converted light source such as a wavelength converted LED. Put in other terms, the wavelength converters described herein may exhibit greater integrated emission of secondary light at the operating conditions of a light source (e.g., at 100 degrees Celsius), relative to the integrated emission of secondary light of a wavelength converter that does not include thermally conductive particles dispersed in a host material but which is otherwise identical.

Although not required, in some embodiments the wavelength converters described herein include a (non-thermally conductive) host material. For example, in some embodiments the wavelength converters described herein include a host material in which a thermally conductive component (e.g., thermally conductive particles) and at least one wavelength conversion material are dispersed. Any suitable material may be used as a host material in such embodiments. Non-limiting examples of suitable host materials include optically transparent materials such as (optically transparent) polymer resins, monomer resins, acrylic polymers, epoxy polymers, silicone polymers, fluorinated polymers, combination thereof, and the like. The host material may have a low thermal conductivity, e.g., relative to the thermally conductive particles that are dispersed therein. For example, in some embodiments the host material may have a thermal conductivity that is less than or equal to 0.2 $Wm^{-1}K^{-1}$.

Alternatively, in some embodiments the wavelength converters described herein include a thermally conductive component in the form of thermally conductive particles, but do not include a host material. For example, in some instances the wavelength converters described herein may be in the form of a layer that comprises, consists essentially of, or consists of a mixture of a thermally conductive component (e.g., thermally conductive particles) and at least one wavelength conversion material. In such embodiments, the thermally conductive particles and wavelength conversion material may be retained on the surface of an underlying support (e.g., a light emitting surface of a LED) in any suitable manner, such as by electrostatic forces. Notably, in these embodiments the wavelength converters do not include any non-thermally conductive host material, and more specifically do not include any organic polymeric host material.

In further non-limiting embodiments the wavelength converters include a thermally conductive component that is or includes a hybrid polymer, such as an optically transparent hybrid polymer. As used herein, a "hybrid polymer" is a polymer that includes both inorganic and organic components, and thus may be referred to as a hybrid inorganic organic polymer. One example of a suitable hybrid inorganic organic polymer that may be used as a thermally conductive component consistent with the present disclosure include the ORMOCLEAR® series of hybrid inorganic organic polymers sold by Micro Resist Technology GMBH on or before Apr. 19, 2017. Of course other hybrid polymers may be used, provided they have suitable properties for use in optical applications (e.g., transparency to incident primary and/or secondary light, resistance to yellowing, etc.). Regardless of the nature of the hybrid polymer, in these embodiments at least one wavelength conversion material may be mixed into or otherwise dispersed in the hybrid polymer, optionally in combination with thermally conductive particles.

As previously noted the wavelength converters of the present disclosure also include at least one wavelength conversion material. In embodiments the wavelength conversion materials are in the form of quantum dots (e.g., semiconductor nanocrystals) and/or particles of other wavelength conversion materials, such as particles of one or more phosphors. Regardless of their nature, the wavelength conversion material(s) may be mixed with or dispersed within thermally conductive component in any suitable manner.

For example, in instances where the thermally conductive component is a thermally conductive polymer, the wavelength conversion material(s) may be present in a homogeneous or heterogeneous distribution within that thermally conductive polymer. In the case of a heterogeneous distribution, for example, the wavelength conversion material may be distributed in a pattern within the thermally conductive polymer and/or at one or more surfaces thereof. For example, the wavelength converter may be or include a single layer of a thermally conductive polymer with an upper surface, a lower surface, and a middle portion, wherein the wavelength conversion material is distributed therein such that a concentration of wavelength conversion material is higher proximate the middle portion, higher on or proximate the upper surface, higher on or proximate the lower surface, or a combination thereof. Without limitation, in embodiments the thermally conductive component is a thermally conductive polymer (e.g., a hybrid polymer), and the wavelength conversion material described herein is/are present in a homogenous distribution within the wavelength converter.

Alternatively and as noted above in some embodiments the wavelength converters described herein do not include any (non-thermally conductive) host material, and the thermally conductive component may be in the form of thermally conductive particles. In such instances, the wavelength converter may be or include a layer that comprises, consists of, or consists essentially of a home or heterogeneous mixture of thermally conductive particles and particles of at least one wavelength conversion material.

Still further, in some embodiments the wavelength converters may include a (non-thermally conductive) host material, and the thermally conductive component may be in the form of thermally conductive particles. In such instances the wavelength converter may be or include a layer of the host material, wherein the layer includes thermally conductive particles and particles of at least one wavelength conversion material dispersed therein. Like the embodiments in which a thermally conductive polymer is used, the thermally conductive particles and/or wavelength conversion material may be present in a homogeneous or heterogeneous distribution within the host material. In the case of a heterogeneous distribution, for example, the thermally conductive particles and/or wavelength conversion material may be distributed in a pattern within the host material and/or at one or more surfaces thereof. In some embodiments the wavelength converter may be or include a single layer of a host material with an upper surface, a lower surface, and a middle portion, wherein at least one wavelength conversion material and/or thermally conductive particles is/are distributed in the layer such that a concentration of wavelength conversion material(s) and/or thermally conductive particles is higher proximate the middle portion, higher on or proximate the upper surface, higher on or proximate the lower surface, or a combination thereof.

Any suitable type of wavelength conversion material may be used in the wavelength converters described herein. Non-limiting examples of suitable wavelength conversion materials include phosphor particles and quantum dots, though other wavelength conversion materials may also be used.

Generally, a phosphor is a compound capable of emitting, upon excitation by an external energy source (e.g., primary light), useful quantities of radiation (e.g., secondary light") in the visible and/or ultraviolet region of the electromagnetic spectrum via luminescence. Examples of suitable phosphors that may be used include yellow phosphor, green phosphor, red phosphor, and/or combinations thereof. Of course, these example phosphor types are not limiting, and any suitable phosphor may be used in accordance with the present disclosure.

Specific non-limiting examples of phosphors that may be used in accordance with the present disclosure include inorganic phosphors such as oxyfluorate phosphors, nitride (including oxynitride) phosphors, and oxide phosphors (e.g., aluminate garnets, silicates etc.). Still further non-limiting examples of suitable phosphors that may be used include cerium-activated yttrium aluminum garnets (YAG:Ce), cerium-activated yttrium gadolinium aluminum garnets (YGdAG:Ce), cerium-activated lutetium aluminum garnets (LuAG:Ce), europium- or cerium-activated alkaline earth (AE) silicon oxynitride (AE-SiON:Eu, where AE designates at least one element selected from Ba, Sr, and Ca), europium- or cerium-activated metal-SiAlON (M-SiAlON, where M is chosen from alkali ions, rare earth ions, alkaline earth ions, Y, Sc, and combinations thereof), and the like.

The phosphors may be doped with a small amount of an activator ion such as but not limited to cerium, gadolinium, scandium, europium, combinations thereof, and the like. When used, the amount of activator ion may vary widely, e.g., from greater than 0 to about 10 atomic %, such as about 1 to about 5 atomic %, or even about 1 to 2 atomic percent. In one non-limiting embodiment, the wavelength converting particles described herein include phosphor particles that include a combination of two or more of doped YAG, doped LuAG, doped silicates, and doped nitride phosphors.

The average particle size and/or particle size distribution of phosphor particles may affect their performance and/or the ability to distribute such particles within a host material and/or a thermally conductive polymer (when used). It may therefore be desirable to select and/or control the size of phosphor particles that are used in wavelength conversion materials described herein, e.g., based at least in part on their average particle size/distribution, either independently or in relation to the average particle size/distribution of other wavelength conversion material. In some embodiments the phosphor particles described herein have an average particle size ranging from about 1 to about 50 microns, such as about 1 to about 40 microns, about 1 to about 30 microns, or even about 10 to about 40 microns. In some embodiments, the average particle size of the phosphor particles ranges from about 20 to about 40 microns. In those or other non-limiting embodiments the average particle size of the phosphor particles may be larger or smaller than another type of wavelength converting particles that may be used in the wavelength converter, such as but not limited to quantum dots as described below. Nanophosphors (i.e., nanoscale phosphors, in contradistinction to quantum dots) having an average particle size of about 100 to about 200 nanometers (nm) may also be used as or in a wavelength conversion material consistent with the present disclosure.

Quantum dots (i.e., semiconductor nanocrystals)) are another example of a type wavelength converting particles that may be used as a wavelength conversion material consistent with the present disclosure. As used herein, the term "quantum dot" refers to semiconductor nanocrystals that have a radius that is smaller than the Bohr radius (i.e., Bohr exciton radius) of their corresponding bulk semiconductor. Any suitable type of quantum dots may be used, so long as they are capable of converting incident primary light of a first wavelength or wavelength range to secondary light of a second wavelength or wavelength range. Without limitation, in some embodiments the quantum dots described herein are or include core quantum dots (i.e., core semiconductor nanocrystals) that have an average particle size ranging from about 0.1 nanometers (nm) to about 10 nm.

As used herein the term "core quantum dots" refers to semiconductor nanocrystals that may be over coated with one or more organic ligands to prevent agglomeration, facilitate dispersion, and/or to passivate non-radiative recombination centers on the surface. In contrast, the terms "core/shell quantum dots" mean semiconductor nanocrystals in which a first semiconductor nanocrystal forms a "core" that is over coated with a "shell" of a larger bandgap semiconductor nanocrystalline material. Like core quantum dots, core/shell quantum dots may or may not be further over coated with one or more organic ligands to prevent agglomeration, facilitate dispersion, and/or to passivate non-radiative centers. Still further, the term "quantum dot beads" refers to composite particles that include a bead matrix into which a plurality of core quantum dots and/or core/shell quantum dots are incorporated. Thus unless otherwise expressly indicated, the term "quantum dots" encompasses core quantum dots, core/shell quantum dots, and quantum dot beads unless otherwise indicated.

Examples of core quantum dots that may be used as or in a wavelength conversion material in accordance with the present disclosure include one or more luminescent semiconductor nanocrystals, such as but not limited to powdered or particulate forms of one or more of the following semiconductors: CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. In some embodiments, the wavelength conversion material of the present disclosure includes core quantum dots of nanocrystalline indium phosphide (InP). Without limitation, the quantum dots described herein are preferably cadmium free.

Although the present disclosure envisions the use of core quantum dots such as those noted above alone, such materials may suffer from one or more drawbacks which may make them difficult to handle or process without materially impacting their ability to convert incident primary light. Core quantum dots may also exhibit relatively low quantum efficiencies due to non-radiative electron-hole recombination occurring at defects and dangling bonds in or at their surface. Exposure to moisture and oxygen may result in oxidation of the surface of the particle and may adversely modify their performance.

To address that issue the core quantum dots described herein may be coated with one or more "shells," so as to form core/shell quantum dots. In such particles, the "core" is a core quantum dot such as those noted above, and the "shell" is an inorganic and/or organic material that individually coats or encapsulates the core quantum dot particle. Suitable materials for the core of core/shell quantum dots include the core quantum dots noted above. Suitable materials for forming the shell(s) of a core/shell quantum dot include one or more nanocrystalline semiconductor materials having a larger bandgap than the core. Examples of such materials include ZnS and/or a combination of ZnSe and ZnS. In embodiments, core/shell quantum dots having a core of InP and a shell of ZnSe or ZnS are used. Of course, other nanocrystalline semiconductor materials may be used as a shell of a core/shell quantum dot, provided that the shell material has a larger bandgap than the core.

The shell materials may be applied to the core using any technique known in the art. By way of example, the core may be coated with one or more shells using wet chemical synthesis, successive ionic layer adsorption and reaction (SILAR), and the like. In any case the thickness of the shell may vary widely, and may range from about 1 to about 30 nm, such as about 1-20 nm, or even about 1 to about 10 nm. In some embodiments, one or more shells are formed around a core quantum dot. For example the core quantum dot particles may be coated with 1, 2, 3 or more shells, wherein each shell may be selected from the aforementioned shell materials.

Quantum dot beads are another form of quantum dots that may be used as a wavelength conversion material consistent with the present disclosure. In general, quantum dot beads comprise a bead matrix that encapsulates a plurality of core quantum dots, core/shell quantum dots, or a combination thereof. In some embodiments the bead matrix is an optically transparent medium, such as but not limited to an optically transparent resin, polymer (e.g., silicone, epoxy, (meth)acrylate, etc.), glass (e.g., silica), sol gel or the like). More specific non-limiting examples of suitable bead matrix materials include acrylate polymers such as polymethyl (meth)acrylate, polybutylmethacrylate, polyoctylmethacrylate, alkylcyanoacrylates, polyethyleneglycol dimethacrylate, lauryl methacrylate, polyvinylacetate etc., epoxides such as EPOTEK 301 A+B Thermal curing epoxy, EPOTEK OG112-4 single pot UV curing epoxy, or EX0135A and B thermal curing epoxy, polyamides, polyimides, polyesters, polycarbonates, polythioethers, polyacrylonitriles, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose, and combinations thereof.

Although a wide variety of bead matrixes are envisioned, use of a bead matrix that has an optical index that significantly differs from that of the host material may introduce interfaces with the host material that may scatter, reflect, and/or refract light within the wavelength converter. Therefore in some embodiments the bead matrix and host material are selected such that they have relatively close or even identical optical indices. For example, in some embodiments the host material may exhibit a first optical index n1, the bead matrix may exhibit a second optical index n2, and n1 may differ from n2 by less than or equal to 15%, 10%, 5%, 1%, or even 0.1%. In some embodiments, n1 equals n2. In some embodiments, the host material exhibits an optical index n1 ranging from about 1.2 to about 2.1, such as above 1.4 to about 1.6, and the bead matrix of the quantum dot beads exhibit an optical index n2 that is the same as n1, or differs from n1 within the foregoing ranges.

Like core quantum dots the quantum dot beads described herein may also be coated with one or more layers or shells of an inorganic or organic material, e.g., for the purpose of limiting contact of the quantum dot particles with oxygen. In that regard any suitable material may be used to coat the quantum dot beads, such as but not limited to the nitrides, oxides and organic materials identified above as being suitable for coating core quantum dot particles.

As shown above a wide variety of quantum dots may be used as or in a wavelength conversion material consistent with the present disclosure. As specific non-limiting examples of suitable core quantum dots, core/shell quantum dots, and quantum dot beads that may be used, mention is made of the core quantum dots, core/shell quantum dots, and quantum dot beads described in U.S. Pre-Grant Publication No. 2013/0189803, the entire content of which is incorporated herein by reference. Without limitation, in some embodiments the quantum dots described herein are one or more types of quantum dot beads.

The particle size of quantum dot beads may impact their ability to be distributed within the host material. It may therefore be desirable to select and or use quantum dot beads based at least in part on their average particle size. Without limitation, in some embodiments the quantum dot beads described herein have an average particle size ranging from about 1 to about 50 microns, such as about 1 to about 40 microns or even about 1 to about 30 microns. In these or other non-limiting embodiments the average particle size of the quantum dot beads may be larger or smaller than another type of wavelength conversion material within the polymeric matrix and matrix precursor, such as but not limited to phosphor particles as noted above.

The wavelength conversion material(s) used herein may present processing and/or other challenges. For example unless specific action is taken, quantum dots may tend to agglomerate together to form agglomerates, wherein the agglomerates are of a size that is larger (e.g., several times larger) than individual particles/nanocrystals of the wavelength conversion material (e.g., an individual quantum, dot). As such agglomerates may exhibit optical and/or other properties that differ from the properties of individual (i.e., non-agglomerated) particles/semiconductor nanocrystals of wavelength conversion material, it may be desirable to take steps to limit and/or prevent agglomeration of the wavelength conversion materials used in the context of the present disclosure. Thus for example, in some embodiments the wavelength conversion material (e.g., quantum dots) may be coated or otherwise treated with one or more organic or inorganic ligands to limit and/or prevent their agglomeration, facilitate dispersion, and/or to passivate non-radiative recombination centers on the surfaces thereof. Of course, such treatment may not be necessary in all instances, such as when particles of wavelength conversion materials that do not tend to agglomerate are used.

In embodiments of the present disclosure the wavelength converters described herein include at least one wavelength conversion material that includes non-agglomerated (i.e., individual) quantum dots (e.g., core quantum dots, core/shell quantum dots, and/or quantum dot beads). In some instances, the wavelength conversion material comprises, consists essentially of, or consists of one or more non-agglomerated wavelength conversion materials, such as but not limited to non-agglomerated quantum dots.

In some embodiments the wavelength converters described herein include one or more than one type of wavelength conversion material. For example the wavelength converters described herein may include a wavelength conversion material that includes at least first and second types of wavelength conversion material, wherein the first type of wavelength conversion material includes phosphor particles selected from those described above, and the second type of wavelength conversion material includes one or more types of quantum dots. In some embodiments the first type of wavelength conversion material includes particles/nanocrystals of at least one of the phosphors described above, and the second type of wavelength conversion material includes at least one type of the quantum dots described above. For example, in some instances the wavelength conversion material may include mint green broadband phosphor particles in combination with red quantum dot beads to produce a warm white light from a light source such as an LED. In other non-limiting embodiments, the wavelength conversion material may include yellow broadband phosphor particles in combination with green and/or red quantum dot beads, which may broaden the white light spectrum. It should therefore be understood that the quantum dots described herein may be used to tune or adjust the light output produced by a light source and/or phosphor particles The total amount of wavelength conversion material included in the wavelength converters described herein may vary widely. In some embodiments, the wavelength conversion material may be present in the wavelength converters described herein in a total amount ranging from about 1 to about 70% by weight, such as about 1 to about 50%, about 5 to about 40%, about 10 to about 30%, or even about 20 weight %, relative to the total weight of the wavelength converter.

In instances where multiple types of wavelength conversion materials are used, the relative amounts of the different types of wavelength conversion material may be the same or different from one another. For example where phosphor particles are used as a first wavelength conversion material and quantum dots are used as a second wavelength conversion material, the amount of phosphor particles and quantum dots may vary widely, either independently or with respect to one another. For example the quantum dots may be present in an amount ranging from about 10 to about 50 weight % (e.g., about 10 to about 40 weight % or even about 10 to about 20 weight %), relative to the total weight of the wavelength converter, whereas the phosphor particles may be present in an amount ranging from about 1 to about 20 weight % (such as about 10 to about 20 weight %) of the wavelength converter.

In instances where the wavelength conversion materials are in the form of particles/nanocrystals, (e.g. quantum dots and/or particles/nanocrystals of a phosphor), the shape of such particles may have an impact on manufacturing and/or performance of the wavelength converters described herein.

Thus, it may be desirable to select or control the shape of the wavelength conversion material used in the wavelength converters of the present disclosure. In that regard the wavelength conversion material(s) may include particles/nanocrystals of any suitable shape may be used. For example, the wavelength conversion materials described herein may include particles/nanocrystals that have a spherical, spheroidal, rod-like (e.g., nanorod), tetrapod, flake, whisker, etc. shape, combinations thereof, and the like. Without limitation, in embodiments the wavelength conversion materials comprise, consist essentially of, or consist of spherical wavelength converting particles, such as spherical phosphors and/or spherical quantum dots.

As noted above the wavelength converters described herein may include thermally conductive particles as or in a thermally conductive component within a host material and/or a thermally conductive polymer. In such instances the thermally conductive particles are particles of one or more materials that have a thermal conductivity that is higher than the thermal conductivity of the host material or thermally conductive polymer. That is, in some embodiments the host material/thermally conductive polymer may exhibit a first thermal conductivity and the thermally conductive particles may exhibit a second thermal conductivity, wherein the second thermal conductivity is higher than the first thermal conductivity. In some embodiments, the thermally conductive particles comprise particles of at least one material that has a thermal conductivity greater than or equal to about 4 $Wm^{-1}K^{-1}$, such as greater than or equal to about 10 $Wm^{-1}K^{-1}$, greater than or equal to about 20 $Wm^{-1}K^{-1}$, or even greater than or equal to about 40 $Wm^{-1}K^{-1}$. Without limitation, in embodiments the thermally conductive particles are optically transparent particles of at least one material having a thermal conductivity (TC) within one or more of the foregoing ranges.

Non-limiting examples of suitable materials that may be used as thermally conductive particles consistent with the present disclosure include metal oxides and metal nitrides, such as but not limited to aluminum oxide ($Al_2O_3$; TC ranging from 12-38.5 $Wm^{-1}K^{-1}$)), aluminum nitride (TC ranging from about 17 $Wm^{-1}K^{-1}$ to 285 $Wm^{-1}K^{-1}$), titanium oxide ($TiO_2$) TC ranging from 4.8-11.8 $Wm^{-1}K^{-1}$), titanium nitride (TiN; TC of about 28.8 $Wm^{-1}K^{-1}$), zinc oxide (TC of about 40 $Wm^{-1}K^{-1}$), yttrium aluminum garnet (YAG; TC of about 14 $Wm^{-1}K^{-1}$), hexagonal or crystalline Boron Nitride (BN; TC>600 $Wm^{-1}K^{-1}$), graphene (TC of about 2000 $Wm^{-1}K^{-1}$), diamond (TC of about 600-2000 $Wm^{-1}K^{-1}$) combinations thereof, and the like. Without limitation, in some embodiments the thermally conductive particles are particles of aluminum oxide, titanium oxide, zinc oxide, or a combination thereof.

The particle size and/or particle size distribution of the thermally conductive particles may affect their performance and/or their ability to be distributed within a host material and/or thermally conductive polymer. It may therefore be desirable to select thermally conductive particles for use in the wavelength conversion materials described herein based at least in part on their particle size/distribution, either independently or in relation to the particle size/distribution of the wavelength converting particles described above. Therefore in some embodiments the thermally conductive particles may have an average particle size ranging from greater than 0 to less than 2 microns (μm), such as from about 10 nanometers (nm) to about 1 μm, about 100 nm to about 1 μm, or even about 100 nm to about 500 nm.

The amount of thermally conductive particles used in the wavelength converters described herein may vary widely, and any suitable amount of thermally conductive particles may be used. It may be appreciated, however, that the amount of thermally conductive particles may impact various performance characteristics of a wavelength converter. For example, as the amount of thermally conductive particles increases, the thermal conductivity of the wavelength converter may correspondingly increase. Use of excessive amounts of thermally conductive particles, however, may negatively affect the light output of the wavelength converter, e.g., by increasing scattering of secondary light, hindering out coupling of primary/secondary light into the area downfield of the wavelength converter, etc. It may therefore be desirable to control the amount of thermally conductive particles used in the wavelength converter to achieve a desired balance between enhanced thermal conductivity and optical properties. With that in mind, in embodiments the thermally conductive particles may be present in an amount ranging from about 99.99 to about 80% by weight (e.g., about 099.99 to about 90 weight % or even about 99.99 to about 95 weight %), relative to the total weight of the wavelength converter.

The shape of the thermally conductive particles may also have an impact on manufacturing and/or performance of the wavelength converters described herein. Thus, it may be desirable to use thermally conductive particles that have a desired shape in the wavelength converters of the present disclosure. In that regard thermally conductive particles of any suitable shape may be used. For example, the thermally conductive particles may be or include spherical particles, spheroidal particles, flakes, whiskers, combinations thereof, and the like. Without limitation, in embodiments the thermally conductive particles comprise, consist essentially of, or consist of spherical thermally conductive particles, such as spherical metal oxide or metal nitride particles (e.g. spherical $TiO_2$, spherical $Al_2O_3$). Alternatively or additionally, in some embodiments the thermally conductive particles comprise, consist essentially of, or consist of flakes and/or whiskers (e.g., of boron nitride, graphene, or a combination thereof). In some embodiments, the thermally conductive particles used are monodisperse or substantially monodisperse in size.

The wavelength converters consistent with the present disclosure may be formed by any suitable method. In some embodiments for example, a wavelength converter may be formed by forming a "precursor" of the wavelength converting material (hereinafter, "converter precursor"). In general, the converter precursors described herein include a combination of a thermally conductive component and wavelength conversion material that is to be used during the formation of a wavelength converter. In some embodiments the converter precursor includes a wavelength conversion material and thermally conductive particles (as a thermally conductive component) in a precursor of a host material (hereinafter, "host material precursor"), and optionally in a liquid phase ("solvent). Such precursors may be formed, for example, by combining (e.g., by mixing or some other methodology) the thermally conductive particles and wavelength conversion material with the host material precursor (and the optional liquid phase, when used). In instances where no host material is used, the converter precursor may include a mixture or blend of thermally conductive particles and wavelength conversion material, optionally in a liquid phase (e.g., a solvent such a toluene). Still further, in embodiments where the thermally conductive component is or includes a thermally conductive polymer, the converter precursor may include one or more wavelength conversion materials dispersed in a liquid precursor of the thermally conductive polymer and/or a solution/dispersion/suspension of the thermally conductive polymer in a liquid phase.

In any case, the converter precursor may be used to form a wavelength converter by any suitable method. For example, when the converter precursor includes a liquid phase (e.g., of a polymer or a solvent), the converter precursor may be deposited on a substrate or other support, e.g., via drop casting, tape casting, spin coating, other the like. Subsequently, the liquid phase may be removed (e.g., via evaporation or another process), and the polymeric components (if any) may be allowed to cure/polymerize/dry, resulting in the formation of a single layer wavelength converter that includes a thermally conductive component with wavelength conversion material mixed with or dispersed in the thermally conductive component. In some instances, a wavelength converter may be formed by drop casting a dispersion containing a wavelength conversion material, thermally conductive particles, and a host material on a substrate, after which the dispersion is dried. In other embodiments a wavelength converter may be formed by drop casting a dispersion containing wavelength conversion material, thermally conductive particles, and no host material on a substrate, after which the dispersion is dried to form a layer comprising, consisting essentially of, or consisting of a mixture of wavelength conversion material (e.g., quantum dots) and thermally conductive particles. And still further, in some embodiment a wavelength converter may be formed by drop casting a dispersion containing a thermally conductive polymer (e.g., an inorganic-organic hybrid polymer such as ORMOCLEAR) and wavelength converting particles on a substrate, after which the dispersion is dried to form a layer of thermally conductive polymer containing wavelength conversion material.

The wavelength converters described herein may be formed to any suitable thickness. For example, in some embodiments the wavelength converters described herein may have a thickness ranging from the thickness of a monolayer of thermally conductive particles and/or wavelength conversion material (whichever is larger) to a total thickness of about 500 microns or more. Without limitation, in some embodiments, the wavelength converters described herein have a total thickness ranging from about 100 nm to about 250 µm, such as about 100 nm to about 150 µm, about 100 nm to about 100 µm, or even about 100 nm to about 10 µm.

The thickness and refractive index of the wavelength converters may have an impact on their optical performance. For example, such properties may impact the manner and degree to which primary and secondary light are scattered. More specifically, the difference between index of refraction of wavelength converter can affect the degree to which primary and/or secondary light is scattered by the converter. If desired, that phenomenon may be leveraged to increase the conversion of primary (e.g., blue) light incident on the wavelength converter to secondary light. That is, such scattering may be utilized to enhance conversion efficiency by dispersing incident primary light within the wavelength converter, thereby increasing the probability that such light will be incident on a wavelength conversion material and be converted to secondary light. Such scattering can also result in light loss, however, and therefore it may be desirable to optimize the refractive index and/or the particle size of the thermally conductive particles and/or wavelength converting particles so as to achieve high light conversion efficiency while reducing or minimizing losses due to scattering.

Another aspect of the present disclosure relates to lighting devices that include a wavelength converter consistent with the present disclosure. Although the present disclosure contemplates the use of the wavelength converters and wavelength conversion materials in a wide variety of lighting devices, such converters and converting compositions may be particularly suitable for use in lighting devices that include a solid state light source such as a light emitting diode package. In such application, the wavelength converters described herein may convert incident primary light emitted from a light emitting diode and convert all or a portion of such light to secondary light.

Reference is therefore made to FIG. 1, which depicts one example of a lighting device that includes a wavelength converter consistent with the present disclosure. As shown, the lighting device 100 includes a light source 101. While a wide variety of light sources may be used as the light source 101, for the sake of illustration the present disclosure will focus on embodiments in which the light source 101 is an LED. Therefore and as shown in FIG. 1, the light source 101 includes a light emitting surface 102.

In various embodiments the light source 101 is an LED that is configured to emit primary light, e.g., in the ultraviolet, visible, and/or infrared region(s) of the electromagnetic spectrum. Without limitation, in some embodiments the light source 101 is an LED configured to emit blue primary light. Regardless of its nature, the light source 101 may emit primary light (not shown) from an emitting surface 102 thereof in any direction. Subsequent to emission by the light source 101, at least a portion of the primary light may impinge on the wavelength converter 103.

Figure 2:
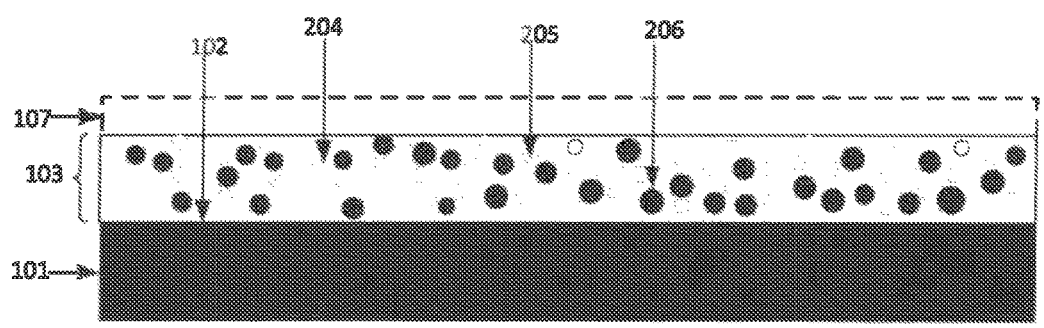
FIG. 2 illustrates another example of a lighting device including a wavelength converter consistent with the present disclosure.

Consistent with the foregoing discussion, the wavelength converter 103 may include a thermally conductive component and a wavelength conversion material mixed with or dispersed within the thermally conductive component. The thermally conductive component may be thermally conductive particles, a thermally conductive polymer, or a combination thereof. In some embodiments, the thermally conductive component is thermally conductive particles, the wavelength conversion material is or includes quantum dots, and the wavelength converter does or does not include a host material. In that regard, FIG. 2 depicts one example of a light source 200 that includes a wavelength converter that includes a host material 204, particles of a wavelength conversion material 205, and thermally conductive particles 206, wherein the wavelength conversion material 205 and thermally conductive particles are dispersed (e.g., homogenously) within the host matrix 204. For the sake of example, the wavelength conversion material 205 and the thermally conductive particles 206 are illustrated in FIG. 2 as being present in a homogenous distribution within wavelength converter 103. Such illustration is for the sake of example only, and as noted above the wavelength conversion material 205 and the thermally conductive particles 206 may be present within in wavelength converter 103 in any suitable distribution, such as a heterogeneous distribution.

Figure 3:
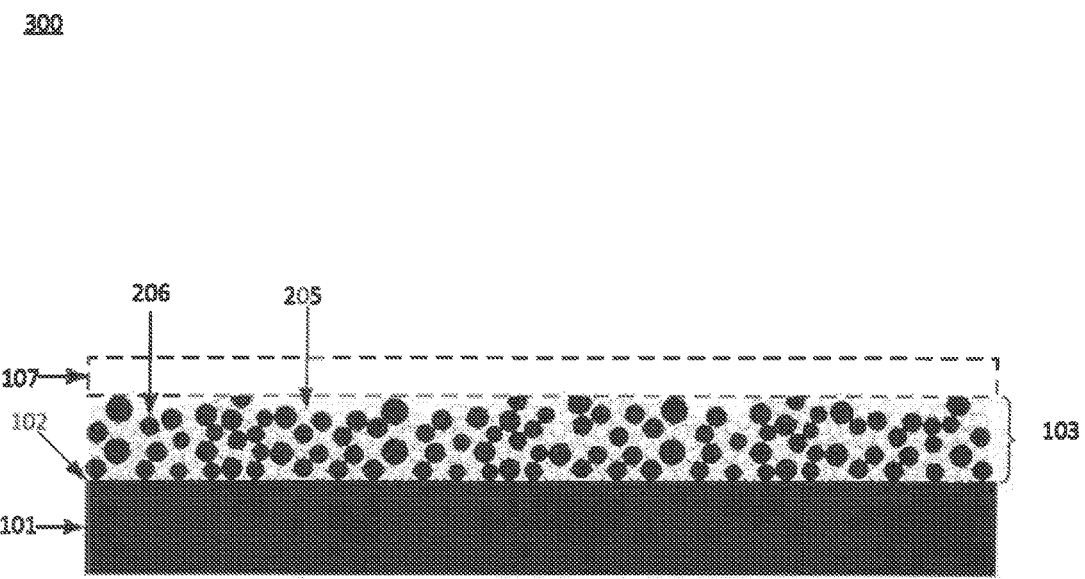
FIG. 3 illustrates another example of a lighting device including a wavelength converter consistent with the present disclosure.

In contrast, FIG. 3 depicts one example of a light source 300 that includes a includes a wavelength converter that includes a layer that comprises, consists essentially of, or consists of particles of a wavelength conversion material 205 and thermally conductive particles 206 and which does not include a host material. For the sake of example, the wavelength conversion material 205 and the thermally conductive particles 206 are illustrated in FIG. 3 as being present on light emitting surface 102 in the form of a layer of loose (i.e., unsintered) particles. In such instances it may be understood that electrostatic or other forces may retain the wavelength conversion material 205 and the thermally conductive particles 206 on the light emitting surface 102. In embodiments, the layer and/or mixture of wavelength conversion material 205 and the thermally conductive particles 206 may be subject to compaction or other processes to facilitate the retention of such components on light emitting surface 102.

Figure 4:
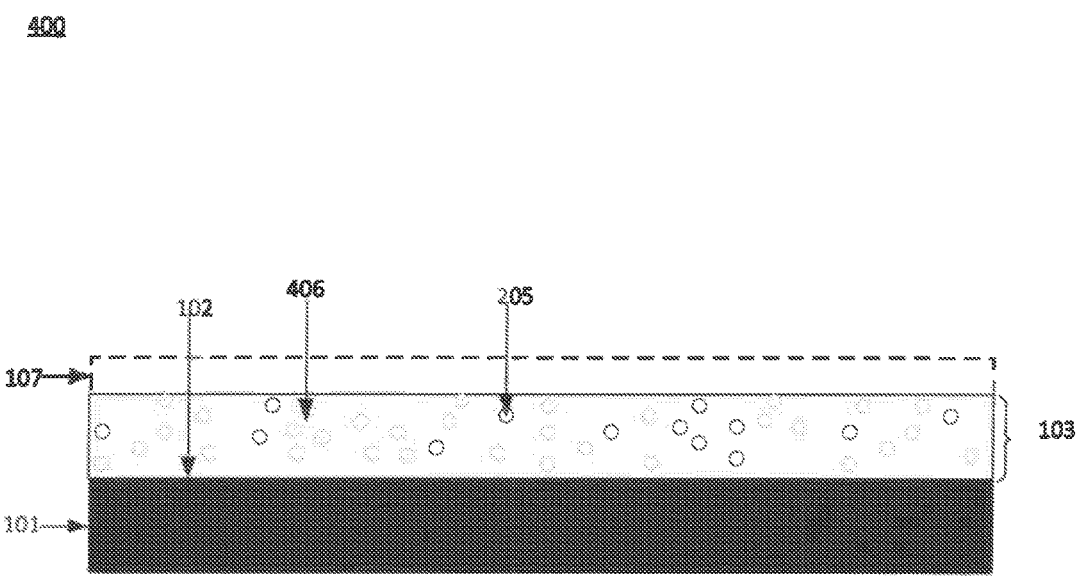
FIG. 4 illustrates another example of a lighting device including a wavelength converter consistent with the present disclosure.

In contrast to FIGS. 2 and 3, FIG. 4 depicts one example of a light source 400 that includes a layer of a thermally conductive polymer 406 as a thermally conductive component. As further shown in that illustrated embodiment, wavelength conversion material 205 is dispersed within the layer of thermally conductive polymer 406. Although not shown in the FIGS. it is noted that thermally conductive particles (such as those shown in FIGS. 2 and 3) may also be included in the embodiment of FIG. 4, e.g., as particles dispersed within thermally conductive polymer 406.

Non-limiting examples of host material 204 include the optically transparent polymers described previously. Non-limiting examples of the wavelength conversion material 205 include phosphor particles/nanocrystals and quantum dots, as previously described. Non-limiting examples of the thermally conductive particles 206 include metal oxide and metal nitride particles with a thermal conductivity greater than or equal to about 4 $Wm^{-1}K^{-1}$, as previously described. Non-limiting examples of the thermally conductive polymer 406 include hybrid inorganic organic polymers, such as ORMOCLEAR® as previously described.

Without limitation, in some embodiments wavelength conversion material 205 comprises, consists essentially of, or consist of non-agglomerated quantum dots, such as but not limited to non-agglomerated core quantum dots, core/shell quantum dots, and quantum dot beads, as previously described. In such embodiments or in other embodiments, thermally conductive particles 206 comprise, consist essentially of, or consist of particles of at least one material having a thermal conductivity greater than or equal to about 4 $Wm^{-1}K^{-1}$, such as but not limited to particles of $ZnO$, $TiO_2$, $YAG$, $Al_2O_3$, or a combination of two or more thereof.

For the sake of illustration and ease of understanding the light sources 100, 200, 300, 400, and 900 are illustrated as including a single wavelength converter 103 that is in direct contact with light emitting surface 102. It should be understood that this is exemplary only, and that more than one wavelength converters 103 may be used and the position of such wavelength converter(s) may vary. For example, in some embodiments the lighting devices 100, 200, 300, 400 may include a first wavelength converter 103 disposed directly on an emitting surface 102 of the light source 101, and one or more additional (e.g., second, third, fourth, etc.) wavelength converters may be disposed on (e.g., directly on) an upper surface of the wavelength converter 103. Alternatively, in embodiments the wavelength converter 103 may be spaced apart from the light emitting surface 102 of light source 101, e.g., in a remote phosphor configuration.

The lighting devices 100, 200, 300, 400, 900 may further include an optional component 107 as shown in FIGS. 1-4 and 9. In some embodiments the optional component 107 may function to seal one or more exposed surfaces of the wavelength converter 103, thereby insulating the upper surface of the wavelength converter 103 from the ambient environment. In such instances the optional component 107 may be understood to be a sealing layer. As may be appreciated, a sealing layer may be of use in instances where wavelength conversion material 205 includes or is formed from elements and/or compounds that can react with elements (e.g., oxygen) in the ambient atmosphere, potentially hindering their ability to convert primary light from the light source 101 to secondary light. Optional component 107 may, therefore, be formed from any suitable sealing material. Non-limiting examples of such materials include optically transparent polymers such as an optically transparent silicone, transparent epoxy, or the like.

Alternatively or additionally, the optional component 107 may in the form of an optical component such as but not limited to a lens. Therefore while the optional component 107 is depicted in FIGS. 1-4 in the form of a layer, it should be understood that it may have any suitable geometry. For example, the optional component 107 may have a lenticular or other geometry, such as the geometry shown in FIG. 9 (which depicts an optional component 907 in the form of a lens). In either case, the optional component may be adhered to the surface of the wavelength converter 103 with or without the use of an adhesive, such as optical glue.

It is noted that for clarity and ease of understanding, the lighting devices 100, 200, 300, 400, 900 are illustrated in FIGS. 1-4 and 9 with limited components. It should be understood that the lighting devices described herein are not limited to the illustrated components, and may include various other elements as would be understood by one of ordinary skill in the art. For example, in some embodiments the lighting devices 100, 200, 300, 400, 900 may include and/or be formed on an underlying substrate, such as a circuit board or other driving electronics as would be understood by those of ordinary skill in the art of light emitting devices. In that regard reference is again made to FIG. 9, which depicts a lighting device 900 consistent with the present disclosure, and which includes a support 901. Without limitation, the support 901 may be in the form of a circuit board containing electrical circuits, contacts, etc. for driving the light source 101. Alternatively or additionally, the support 901 may be a support structure that provides mechanical support for other components in the light source 100, 200, 300, 400, 900 e.g., an LED lighting package.

Another aspect of the present disclosure relates to methods of manufacturing a wavelength converted lighting device consistent with the present disclosure. In the regard reference is made to FIG. 5, which is a flow chart of example operations consistent with one embodiment of a method of making a lighting device including a wavelength converter consistent with the present disclosure. For the sake of illustration and ease of understanding, the operations of FIG. 5 will be described in conjunction with FIGS. 6A-8C, which stepwise illustrate the formation of various wavelength converted lighting devices consistent with the present disclosure. It should be understood that the operations of FIG. 5 and the illustrations shown in FIGS. 6A-8C are for the sake of example only, and that wavelength converters consistent with the present disclosure may be manufactured in a different manner. For example while FIGS. 6A-8C depict the formation of a wavelength converter directly on a light emitting surface of an LED, it is possible to form wavelength converters consistent with the present disclosure separately, i.e., without the use of a light source. Moreover while FIGS. 3A-8C depict the formation of a single wavelength converter on a single light source, one of ordinary skill in the art will understood that the methods described herein may be scaled to produce multiple wavelength converters, e.g., on an array of light sources (e.g., an array of LEDs or LED packages)

Figure 5:
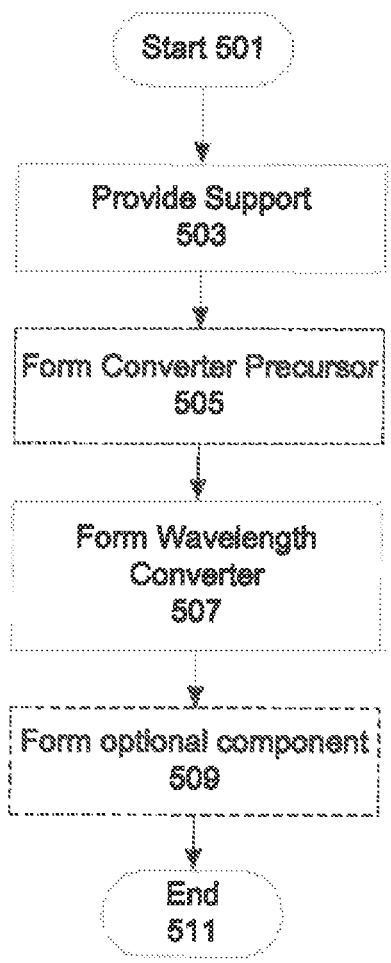
FIG. 5 is a flow chart of example operations of one example of a method of forming a lighting device including a wavelength converter consistent with the present disclosure.
Figure 6A:
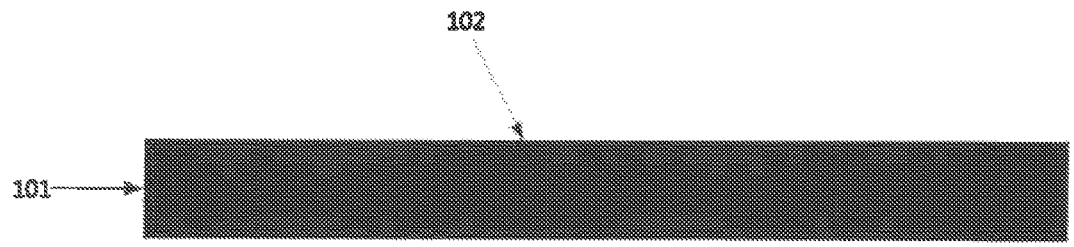
FIGS. 6A-6C stepwise illustrate one example of the formation of a first example wavelength converter in accordance with a method consistent with the present disclosure.
Figure 7A:
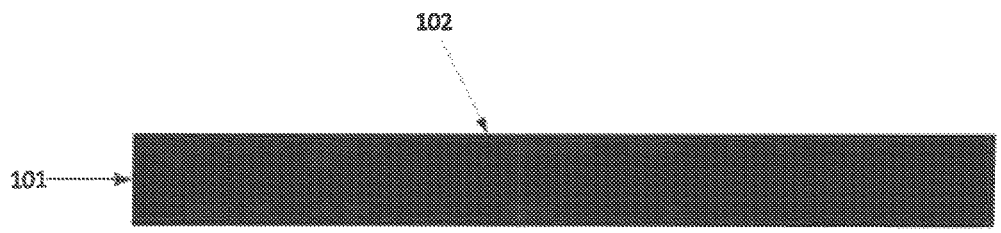
FIGS. 7A-7C stepwise illustrate one example of the formation of a second example of a wavelength converter in accordance with a method consistent with the present disclosure.
Figure 8A:
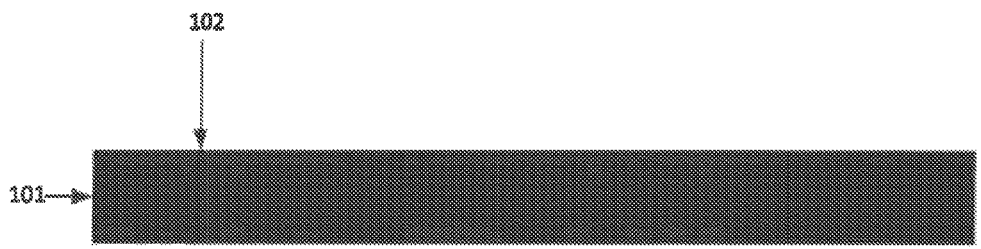
FIGS. 8A-8C stepwise illustrate one example of the formation of a third example of a wavelength converter in accordance with a method consistent with the present disclosure.

Turning now to FIG. 5, as shown the method 500 begins at block 501. The method may then proceed to block 503, pursuant to which one or more supports may be provided. Any suitable support may be used, such as a substrate, circuit board, light emitting surface of a light source, etc. Without limitation in some embodiments the support provided pursuant to block 503 is a light emitting surface of a light source, such as an LED. Such an operation is depicted in FIGS. 6A, 7A, and 8A, each of which illustrate the provision of a light source 101 including a light emitting surface 102, as previously described. For example, in some embodiments one or more LEDs, LED packages, arrays of LED packages, etc. may be provided pursuant to block 503, e.g., in isolated form or supported by another component such as a circuit board. In any case, the light source(s) 101 may be configured to emit primary light in a first wavelength or wavelength range, as noted above.

The method 500 may then proceed to optional block 505, pursuant to which a converter precursor may be formed. For example, pursuant to block 205 in some embodiments a converter precursor may be formed by mixing or otherwise incorporating a wavelength conversion material and thermally conductive particles (as a thermally conductive component) into a precursor of a host material, such as a precursor of an optically transparent polymer. For example, a precursor (e.g., uncured resin) of the host matrix, wavelength conversion material, and thermally conductive particles may be mixed, e.g., using an agitator, ribbon blender, paddle mixer, static mixer, emulsifier, drum mixer, or the like to form a converter precursor in the form of a mixture or a dispersion. Alternatively or additionally, wavelength conversion material and/or thermally conductive particles may be added to a host material precursor via some other method. In such instances, the wavelength conversion material and/or thermally conductive particles may be present in the converter precursor in a homogenous or heterogeneous distribution. For the sake of reference a converter precursor of that type are referred to herein as a "first converter precursor."

Alternatively, a converter precursor may be formed pursuant to block 505 by forming a dispersion of wavelength conversion material and thermally conductive particles (as a thermally conductive component). This may be accomplished, for example, by mixing (e.g., using an agitator, ribbon blender, paddle mixer, static mixer, emulsifier, drum mixer) thermally conductive particles and wavelength conversion material with a liquid phase (e.g., toluene or other suitable organic solvent) or the like to form a dispersion. For the sake of reference a converter precursor of that type are referred to herein as a "second converter precursor."

Still further, a converter precursor of a wavelength converter may be formed by mixing or otherwise incorporating a wavelength conversion material into a thermally conductive polymer or a precursor thereof, such as but not limited to a thermally conductive hybrid inorganic-organic polymer or a precursor thereof. For example, a precursor (e.g., uncured resin) of the thermally conductive polymer and wavelength conversion material may be mixed (e.g., using an agitator, ribbon blender, paddle mixer, static mixer, emulsifier, drum mixer, or the like) to form a mixture or a dispersion. Alternatively or additionally, wavelength conversion material and/or thermally conductive particles may be added to a host material precursor via some other method. In such instances, the wavelength conversion material may be present in the wavelength converter precursor in a homogenous or heterogeneous distribution. For the sake of reference a converter precursor of that type are referred to herein as a "third converter precursor."

Figure 6B:
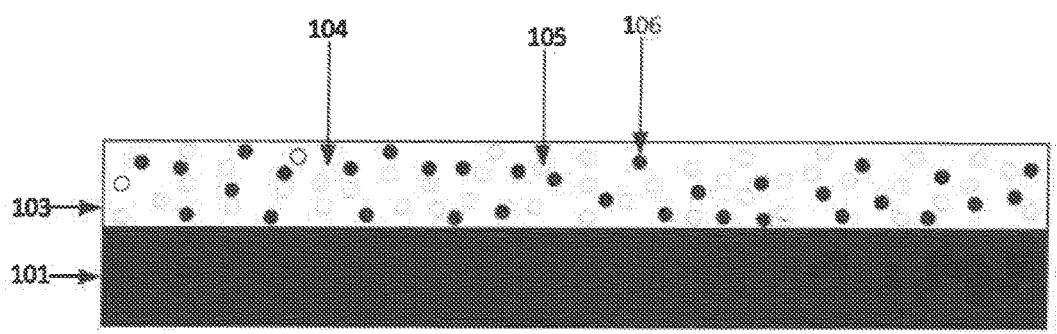
Figure 7B:
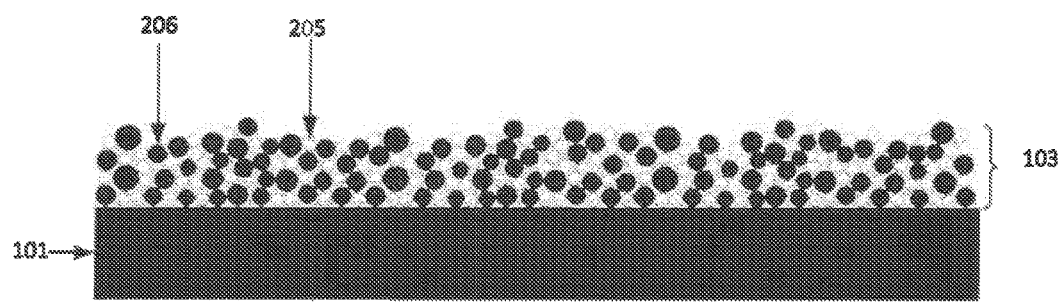
Figure 8B:
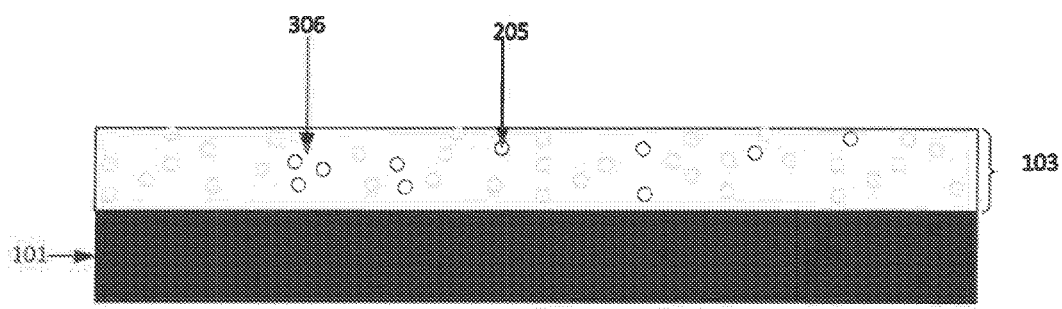

Following the operations of block 505 or if such operations are omitted (e.g., where a converter precursor is previously formed or available commercially) the method 500 may proceed to block 507, pursuant to which a wavelength converter is formed. Formation of a wavelength converter may proceed in any suitable manner. For example, in instances where a first, second, or third wavelength converter precursor has been formed as discussed above, formation of a wavelength converter may proceed by depositing or otherwise forming a layer of wavelength material precursor on a surface of a support, such as but not limited to the light emitting surface of an LED. Deposition of the wavelength converter precursor on the support may be accomplished in any suitable manner, such as but not limited to drop casting, ink-jet printing, tape casting, spin coating, or the like. In any case, following such deposition the wavelength converter precursor may be cured/polymerized in any suitable fashion, resulting in the formation of a wavelength converter consistent with the present disclosure. That concept is shown in FIGS. 6B, 7B, and 8B, which illustrate the formation of a wavelength converter 103 on a light emitting surface 102 of light emitting diode 101 using a first, second, or third converter precursor (respectively), as discussed above.

Figure 6C:
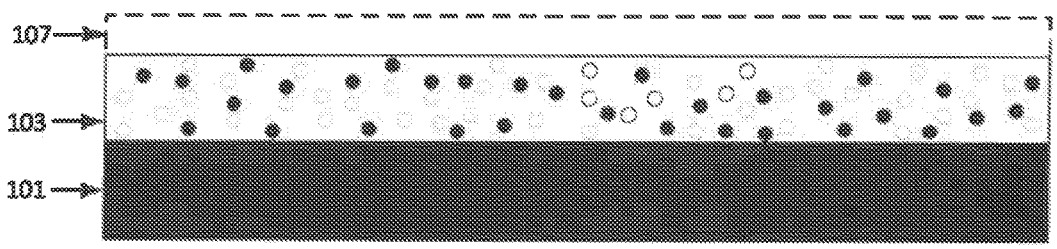
Figure 7C:
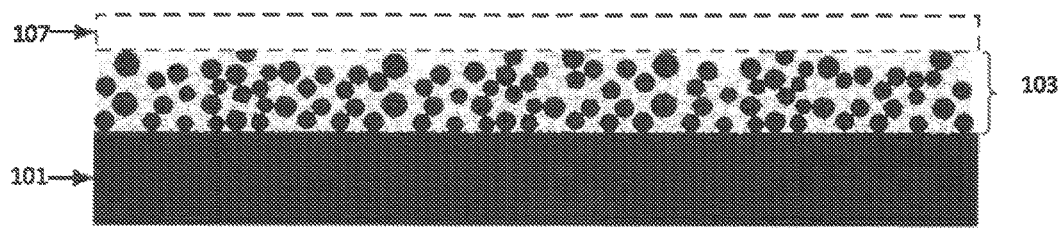
Figure 8C:
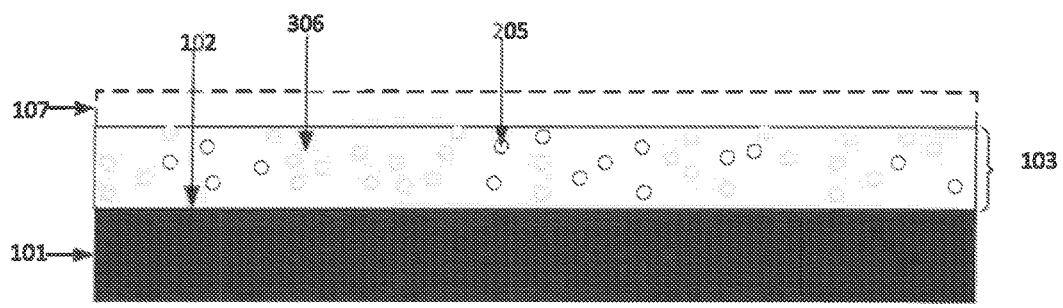
Figure 9:
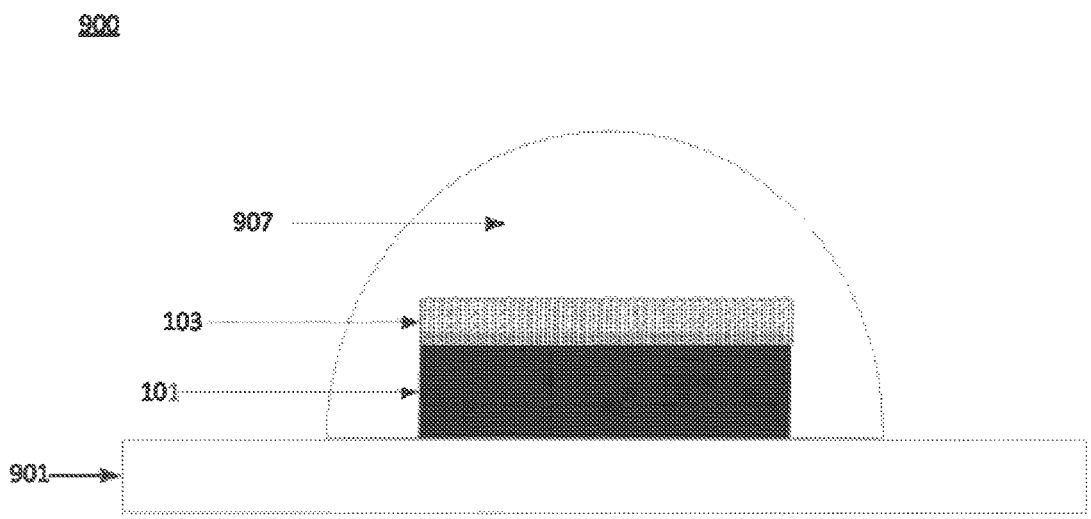
FIG. 9 depicts another example of a lighting device including a wavelength converter consistent with the present disclosure.

The method 500 may then proceed to optional block 509, pursuant to which an optional component may be provided, e.g., to cover/seal one or more surfaces of the wavelength converter as described above. This concept is illustrated in FIGS. 6C, 7C, and 8C, each of which depicts the formation of an optional component 107 on an upper surface of a wavelength converter 103.

For example, one or more surfaces of the wavelength converter may be sealed with a sealing material, such as the sealing materials noted above. Formation of the sealing layer may be accomplished, for example, via drop casting, ink-jet printing, spin coating, combinations thereof, and the like. Alternatively or additionally, one or more surfaces of the wavelength converter may be covered with another type of optional component, such as a lens as previously described. In instances where the lens is formed from a polymeric material, it may be formed by depositing such a polymeric material or a precursor thereof on a surface of the wavelength converter, e.g., by spin coating, ink-jet printing, spin coating, or the like. Alternatively, a lens may be formed separately, and then coupled (e.g., with an adhesive) to one or more surfaces of a wavelength converter, lighting device, or a combination thereof. In the latter case, coupling of a lens to a wavelength converter may be accomplished using so-called "pick and place" technology, wherein a lens may be picked up by a placement arm, appropriately positioned on a surface of a wavelength converter, and bonded into place (e.g., with an adhesive).

Following optional block 509 (or if the operations of that block are omitted), the method 500 may proceed to block 511 and end.

EXAMPLES

For the sake of illustration the present disclosure will now proceed to describe several examples in which a combination of wavelength converting particles are used to form a single layer wavelength converter consistent with the present disclosure. It should be understood that the following examples are representative only, and should not be considered to represent then entire scope of the invention described herein.

To determine the effectiveness of the addition of thermally conductive particles several test wavelength converters were prepared.

Sample 1:

A first sample wavelength converter was prepared by drop casting a dispersion of indium phosphide/zinc sulfide (InP/

ZnS) core/shell quantum dots in toluene (concentration 6 mg/ml) onto a substrate. The liquid was allowed to evaporate, resulting in the formation of a wavelength converter in the form of a layer containing InP/ZnS core/shell quantum dots. The wavelength converter was then encapsulated in a non-permeable package material.

Sample 2:

A second sample wavelength converter was prepared by filling a recess area on a sapphire substrate with one gram of alumina particles. Then, 0.5 µl of a dispersion of indium phosphide/zinc sulfide (InP/ZnS) core/shell quantum dots in toluene (6 mg/ml) was drop cast onto the layer of alumina particles. The liquid was allowed to evaporate, resulting in the formation of a wavelength converter in the form of a layer containing a mixture of InP/ZnS core/shell quantum dots and thermally conductive alumina particles. The wavelength converter was then encapsulated in a non-permeable package material.

Sample 3:

A third sample wavelength converter was prepared, and included InP/ZnS core/shell quantum dots in lauryl methacrylate at an estimated loading of 6 mg quantum dots per milliliter of resin. The wavelength converter was then encapsulated in a non-permeable package material.

Sample 4:

A fourth sample wavelength converter was prepared by mixing one gram of an uncured hybrid polymer (ORMOCLEAR®) and 0.5 µl of a dispersion of InP/ZnS core/shell quantum dots in toluene (5 mg/ml). The resulting converter precursor was drop cast onto a substrate. Crosslinking of the hybrid polymer was initiated by illumination with a 405 nm light, and the composition was cured to form a wavelength converter in the form of a layer of the hybrid polymer including the core/shell quantum dots. The wavelength converter was then encapsulated in a non-permeable package material.

Figure 10:
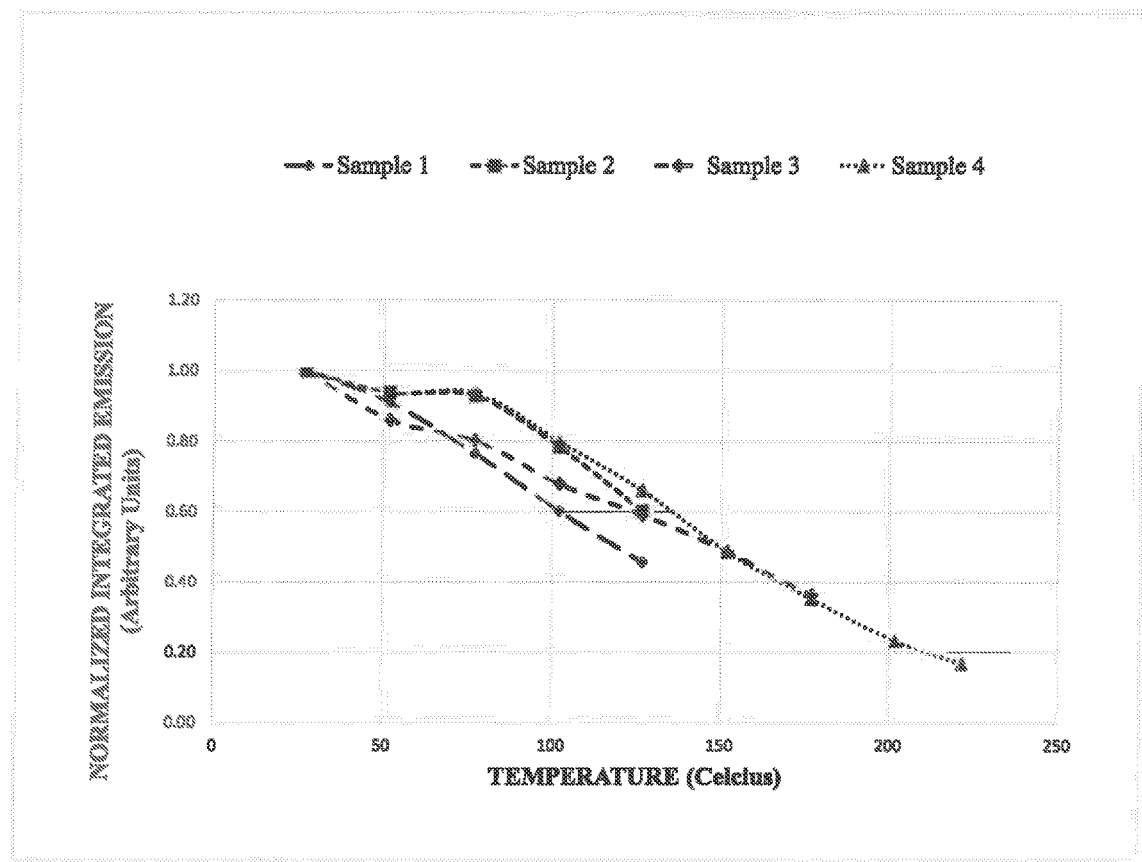
FIG. 10 is a plot of emission intensity versus temperature for various test samples.

The integrated emission (i.e., intensity) of the emission spectra of the samples was evaluated over a temperature range of about 280 to about 500 Kelvin, using a Horiba Jobin-Yvon Fluorolog-3 spectrophotometer. Each sample was placed in the sample compartment of the spectrophotometer, and was exposed to primary light emitted by a xenon lamp. The emission spectra of each sample was then measured using a photomultiplier (PMT) detector or a charge coupled device (CCD) detector. The temperature of the sample under consideration was increased several times, and the integrated emission measurement was repeated across the temperature range. The recorded integrated emission of each sample was then plotted as a function of temperature, as shown in FIG. 10. As can be seen, samples 2 and 4 (which included a thermally conductive component such as thermally conductive particles or a thermally conductive polymer) exhibited a higher integrated emission at 100 degrees Celsius (about 400 Kelvin) than samples 1 and 3 (which did not include a thermally conductive component).

As may be appreciated from the foregoing, the technologies of the present disclosure can enable the formation of wavelength converters with improved thermal conductivity. Such wavelength converters can exhibit improved performance at the operating conditions of a light source, particularly when the wavelength converter includes quantum dots as a wavelength conversion material. Moreover, the wavelength converters can exhibit desirable performance characteristics, and may enable lighting designers to tailor the light output of a lighting device, potentially without having to rely on complex and expensive manufacturing techniques.

EMBODIMENTS

The following are additional embodiments of the present disclosure.

Embodiment 1

According to this embodiment there is provided a lighting device (100, 200, 300, 400, 900) including a wavelength converter (103), wherein the wavelength converter (103) includes a layer including: a thermally conductive component (206, 406); and a wavelength conversion material (205) mixed with or dispersed in the thermally conductive component (206, 406); wherein: the wavelength conversion material (205) includes non-agglomerated quantum dots; and the thermally conductive component is selected from the group consisting of a thermally conductive polymer (406) or thermally conductive particles (206); the thermally conductive polymer has a thermal conductivity greater than 0.2 Watts per meter Kelvin ($Wm^{-1}K^{-1}$); and the thermally conductive particles (206) are particles of at least one material having a thermal conductivity greater than or equal to about 4 $Wm^{-1}K^{-1}$.

Embodiment 2

This embodiment includes any or all of the features of embodiment 1, wherein: the thermally conductive component is the thermally conductive particles (206); and the thermally conductive particles (106) have a mean particle size in the range of about 100 nanometers to about 1 micron.

Embodiment 3

This embodiment includes any or all of the features of embodiment, wherein the thermally conductive component is the thermally conductive particles (206), and the at least one material having a thermal conductivity greater than or equal to about 4 $Wm^{-1}K^{-1}$ is a metal, a metal oxide, a metal nitride, or a combination thereof.

Embodiment 4

This embodiment includes any or all of the features of embodiment 1, wherein the thermally conductive component is the thermally conductive particles (206), and the at least one material having a thermal conductivity greater than or equal to 4 $Wm^{-1}K^{-1}$ is selected from the group consisting of alumina, aluminum nitride, titanium oxide, titanium nitride, zinc oxide, and combinations thereof.

Embodiment 5

This embodiment includes any or all of the features of embodiment 1, wherein the at least one material having a thermal conductivity greater than or equal to 4 $Wm^{-1}K^{-1}$ includes at least one material having a thermal conductivity greater than or equal to 10 $Wm^{-1}K^{-1}$.

Embodiment 6

This embodiment includes any or all of the features of embodiment 1, further including a host material (204), wherein: the thermally conductive component is the thermally conductive particles (206); the at least one material having a thermal conductivity greater than or equal to about 4 $Wm^{-1}K^{-1}$ is a metal, a metal oxide, a metal nitride, or a combination thereof; and the thermally conductive particles (206) and the wavelength conversion material (205) are dispersed within the host material (204).

Embodiment 7

This embodiment includes any or all of the features of embodiment 6, wherein the host material (204) is a polymer.

Embodiment 8

This embodiment includes any or all of the features of embodiment 6, wherein the wavelength conversion material (205) and the thermally conductive particles (206) are homogenously dispersed within the host material (204).

Embodiment 9

This embodiment includes any or all of the features of embodiment 1, wherein the thermally conductive component is the thermally conductive polymer (406), and wavelength conversion material (205) is dispersed in the thermally conductive polymer (406).

Embodiment 10

This embodiment includes any or all of the features of embodiment 1, wherein the wavelength conversion material (205) consists essentially of non-agglomerated quantum dots.

Embodiment 11

This embodiment includes any or all of the features of embodiment 1, wherein the thermally conductive component is the thermally conductive particles, and the wavelength converter (103) consists essentially of a layer of a mixture of the wavelength conversion material and the thermally conductive particles.

Embodiment 12

This embodiment includes any or all of the features of embodiment 1, wherein the wavelength converter (103) exhibits, in response to incident primary light, a first integrated emission at room temperature and a second integrated emission at 100 degrees Celsius, wherein the second integrated emission is greater than or equal to about 80% of the first integrated emission.

Embodiment 13

This embodiment includes any or all of the features of embodiment 1, and further includes a light source (101) including a light emitting surface (102), wherein the wavelength converter (103) is disposed on the light emitting surface (102) or spaced away from the light emitting surface (102).

Embodiment 14

This embodiment includes any or all of the features of embodiment 13, wherein the light source (101) is a light emitting diode (LED).

Embodiment 15

This embodiment includes any or all of the features of embodiment 14, wherein: the light source (101) is configured to emit primary light of a first wavelength or first wavelength range; the non-agglomerated quantum dot particles are configured to convert the primary light to secondary light of a second wavelength or second wavelength range that is different from the first wavelength or first wavelength range; and the wavelength converter (103) exhibits, in response to incident primary light, a first integrated emission at room temperature and a second integrated emission at 100 degrees Celsius, wherein the second integrated emission is greater than or equal to about 80% of the first integrated emission.

Other than in the examples, or where otherwise indicated, all numbers expressing endpoints of ranges, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the present disclosure are approximations, unless otherwise indicated the numerical values set forth in the specific examples are reported as precisely as possible. Any numerical value, however, inherently contains certain errors necessarily resulting from the standard deviation found in their respective testing measurements.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

For ease of reference, the following is a table of reference numerals;

Table 1

TABLE 1

| Reference Number | Element |
| --- | --- |
| 100 | Lighting device |
| 101 | Light source |
| 102 | Emitting surface |
| 103 | Wavelength converter |
| 107 | Optional Component |
| 200 | Lighting device |
| 204 | Host material |
| 205 | Wavelength conversion material |
| 206 | Thermally conductive particles |
| 300 | Lighting device |
| 400 | Lighting device |
| 406 | Thermally conductive polymer |
| 500 | Method |
| 501 | Start |
| 503 | Optional provide support |
| 505 | Optional provide precursor |
| 507 | Form wavelength converter |
| 509 | Optional form optional component |
| 511 | End |
| 900 | Lighting device |
| 901 | Support |
| 907 | Optional Component |

What is claimed is:

1. A lighting device comprising:
a wavelength converter consisting essentially of a layer of a mixture of a wavelength conversion material and thermally conductive particles,
wherein the wavelength conversion material comprises non-agglomerated quantum dots, and
wherein the thermally conductive particles are particles of at least one material having a thermal conductivity greater than or equal to about 4 $Wm^{-1}K^{-1}$.

2. The lighting device of claim 1, wherein
the thermally conductive particles have a mean particle size in a range of about 100 nanometers to about 1 micron.

3. The lighting device of claim 1, wherein the at least one material having a thermal conductivity greater than or equal to about 4 $Wm^{-1}K^{-1}$ is a metal, a metal oxide, a metal nitride, or a combination thereof.

4. The lighting device of claim 1, wherein the at least one material having a thermal conductivity greater than or equal to 4 $Wm^{-1}K^{-1}$ is selected from the group consisting of alumina, aluminum nitride, titanium oxide, titanium nitride, zinc oxide, and combinations thereof.

5. The lighting device of claim 1, wherein the at least one material having a thermal conductivity greater than or equal to 4 $Wm^{-1}K^{-1}$ comprises at least one material having a thermal conductivity greater than or equal to 10 $Wm^{-1}K^{-1}$.

6. The lighting device of claim 1, wherein the wavelength conversion material consists essentially of non-agglomerated quantum dots.

7. The lighting device of claim 1, wherein the wavelength converter is configured to exhibit, in response to incident primary light, a first integrated emission at room temperature and a second integrated emission at 100 degrees Celsius, and wherein the second integrated emission is greater than or equal to about 80% of the first integrated emission.

8. A lighting device of claim 1, further comprising a light source comprising a light emitting surface, wherein the wavelength converter is disposed on the light emitting surface or spaced away from the light emitting surface.

9. The lighting device of claim 8, wherein the light source is a light emitting diode (LED).

10. The lighting device of claim 9, wherein the light source is configured to emit primary light of a first wavelength or first wavelength range,
wherein the non-agglomerated quantum dots are configured to convert the primary light to secondary light of a second wavelength or second wavelength range that is different from the first wavelength or first wavelength range,
wherein the wavelength converter is configured to exhibit, in response to incident primary light, a first integrated emission at room temperature and a second integrated emission at 100 degrees Celsius, and
wherein the second integrated emission is greater than or equal to about 80% of the first integrated emission.

11. A lighting device comprising:
a wavelength converter, wherein the wavelength converter comprises a layer comprising:
a thermally conductive component; and
a wavelength conversion material mixed with or dispersed in the thermally conductive component,
wherein the wavelength conversion material comprises non-agglomerated quantum dots,
wherein the thermally conductive component is at least one thermally conductive polymer, and
wherein the thermally conductive polymer has a thermal conductivity greater than 0.2 Watts per meter Kelvin ($Wm^{-1}K^{-1}$).

12. The lighting device of claim 11, wherein wavelength conversion material is dispersed in the thermally conductive polymer.

13. A lighting device comprising:
a wavelength converter, wherein the wavelength converter comprises a layer comprising:
a thermally conductive component; and
a wavelength conversion material mixed with or dispersed in the thermally conductive component,
wherein the wavelength conversion material comprises non-agglomerated quantum dots,
wherein the thermally conductive component is formed of at least one thermally conductive polymer and thermally conductive particles,
wherein the thermally conductive polymer has a thermal conductivity greater than 0.2 Watts per meter Kelvin ($Wm^{-1}K^{-1}$), and
wherein the thermally conductive particles are particles of at least one material having a thermal conductivity greater than or equal to about 4 $Wm^{-1}K^{-1}$.

* * * * *